(12) United States Patent
Hennig et al.

(10) Patent No.: US 6,191,698 B1
(45) Date of Patent: Feb. 20, 2001

(54) MAGNETIC TESTING APPARATUS

(76) Inventors: Gerhard Hennig, Ammersee-Str. 90, D-82131 Gauting; Martin Voigt, Westerweg 36, D-58675 Hemer, both of (DE)

( * ) Notice: Under 35 U.S.C. 154(b), the term of this patent shall be extended for 0 days.

(21) Appl. No.: 09/468,189

(22) Filed: Dec. 21, 1999

(30) Foreign Application Priority Data

Dec. 21, 1998 (DE) ............................................ 298 22 778 U
Sep. 10, 1999 (DE) ............................................ 299 15 970 U

(51) Int. Cl.$^7$ .................................................... G08B 21/00
(52) U.S. Cl. ...................... 340/686.6; 340/551; 340/514; 324/260
(58) Field of Search ............................. 340/686.6, 686.1, 340/673, 551, 596, 514; 324/260, 261, 262; 73/866.5, 865.8, 866

(56) References Cited

U.S. PATENT DOCUMENTS

| | | | |
|---|---|---|---|
| 4,458,198 | * 7/1984 | Schweitzer | 324/133 |
| 4,675,607 | * 6/1987 | Golker | 324/247 |
| 5,309,097 | * 5/1994 | Bill | 324/258 |
| 5,608,319 | * 3/1997 | Maurer | 324/251 |

\* cited by examiner

*Primary Examiner*—Jeffery A. Hofsass
*Assistant Examiner*—Anh La
(74) *Attorney, Agent, or Firm*—Helfgott & Karas, PC.

(57) ABSTRACT

An apparatus for testing whether the strength of a stray magnetic field emanating from an air freight consignment exceeds a predetermined threshold value has a magnetic field sensor, as a Hall probe, further an optical and/or acoustical alarm device, an electronic circuit coupling the sensor to the alarm device and actuating the alarm device(s) to produce a pre-warning signal, when the strength of the magnetic field sensed exceeds half the threshold value, and a warning signal when the strength of the magnetic field sensed by the sensor exceeds the predetermined threshold value, a nonmagnetic distance determining device, which, when brought in contact with a point on the surface of the consignment establishes a predetermined distance between the contacted surface point and the sensor; and means for self-testing the function of the apparatus.

11 Claims, 2 Drawing Sheets

MAGNETIC TESTING APPARATUS

BACKGROUND OF THE INVENTION

This invention relates in general to a magnetic testing apparatus more specifically it relates to a self controlled magnetic stray field threshold tester which gives warning signals when the external magnetic stray-field of an air freight consignement exceeds a predetermined value in a predetermined distance from the surface of air freight packages containing magnetized material. With air traffic safety involved such an apparatus must include means for self controlling its functioning.

Previously navigation in air traffic was mainly performed by the aid of a magnetic compass. Since air freight consignements containing magnetized materials may disturb the indication of the magnetic compass such shipments are classified as "Dangerous Goods". Although a magnetic compass is no longer of great importance in commercial air traffic, the maximum permitted distortion of the geomagnetic field in a distance of 15 ft (about 4.6 m) from any point of the surface of a consignement will not be changed. This maximum distortion should not exceed 0.418 A/cm –(0, 0053 Oersted)-.

Measuring such a small stray field requires a hardware and personal expenditure that normally is beyond the means of the consignor and the carrier. Furthermore low-field measurements must be performed in an environment free from other magnetic disturbancies such as iron structures etc. In consequence consigments containing magnetized material quite often are not tested at all. On the other hand, the tonnage of magnetized materials, (i.a. strong permanent magnets), shipped by air has increased by more than a factor 100 during the past 15 years. Under those circumstances many shipments have been found with high external stray-fields which even may disturb the function of other air plane equipment.

Thus there exists obviously an essential demand for a simple and inexpensive apparatus which enables also less experienced personnel in normal environment to determine quickly whether a package containing magnetized materialsatifies the above rules.

SUMMARY OF THE INVENTION

It is an object of the invention to provide an apparatus for determining whether the stray field enumating from a given package containing magnetized material is within the permitted range of field strengths. The apparatus should be robust, easy to use and self testing its safe and proper functioning.

The present invention is based on the discovery that for testing, whether an air freight consignement containing magnetized material meets the above rules, a much higher threshold value of the magnetic field strength can be used at a shorter distance than previously stated by the above rules. Thus the distance of 4.6 m as given by the rules is reduced according to the invention to about 10 to 50 cm.

A distance of 20 cm has proved to be a good practical compromise. Here the threshold field is about 30 times higher than the geomagnetic field. Geo-magnetic influences thus will not irritate the user. Although a shorter distance, 10 cm for instance, would even be better in this respect, the correlation to the permisseable stray field in 4.6 m distance becomes much poorer when packages with different arrangements of the magnetized materials have to be considered.

Since magnetized materials —(permanent magnets)— of greatly varying shapes, sizes and arrangements, sometimes additionally with shielding materials are being shipped, the maximum permitted field strength at such reduced distances can not be calculated mathematically. Thus, it has been established by extensive practical tests that, for instance, a field strength threshold value of 10 A/cm, (12,6 Oersted) at a distance of 20 cm will guarantee that the prescribed maximum field strength value at a distance of 4.6 m are not exceeded.

Preferred embodiments of the invention comprise a magnetic field sensor, providing an output signal which is a function of the strength of the magnetic field at the location of the sensor; indicating or alarm device(s) for warning whether the value of the sensed magnetic field strength is above a predetermined threshold value or not; an electronic circuit coupling said sensor to said alarm device(s), said circuit actuating said alarm device(s) if and when the sensed magnetic field strength is above said threshold value; a housing containing said circuit and said sensor; and non-magnetc distance or spacing defining means, which when brought in contact with a point on the surface of the package (consignement) establishes a predetermined distance between said point and said sensor. A "self-test" switch or button energizes an internal coil, located around or near the sensor element with a low electric dc current creating a magnetic field at the location of the sensor element. This magnetic test field being equal or ½ of the permitted threshold field. In order to test proper functioning in both field directions means for reversing said current are provided.

One or more of the following features are further preferred:

The magnetic field sensor comprises a Hall probe or similar device

The housing contains or supports the magnetic field sensor, the alarm device(s) and switch for activating apparatus;

The circuit provides an output signal independent of the polarity of the input signal of the magnetic field sensor;

The circuit comprises an amplifier;

A rechargeable battery energizes the circuit;

Recharging means to be connected to the mains is included or attached;

The circuit produces one warning signal when half the predetermined threshold value is reached and another when it is exceeded.

BRIEF DESCRIPTION OF THE DRAWINGS

In the detailed description of the preferred embodiment of the invention presented below, reference is made to the accompanying drawings, in which.

DESCRIPTION OF THE PREFERRED EMBODIMENT

Figure 1:
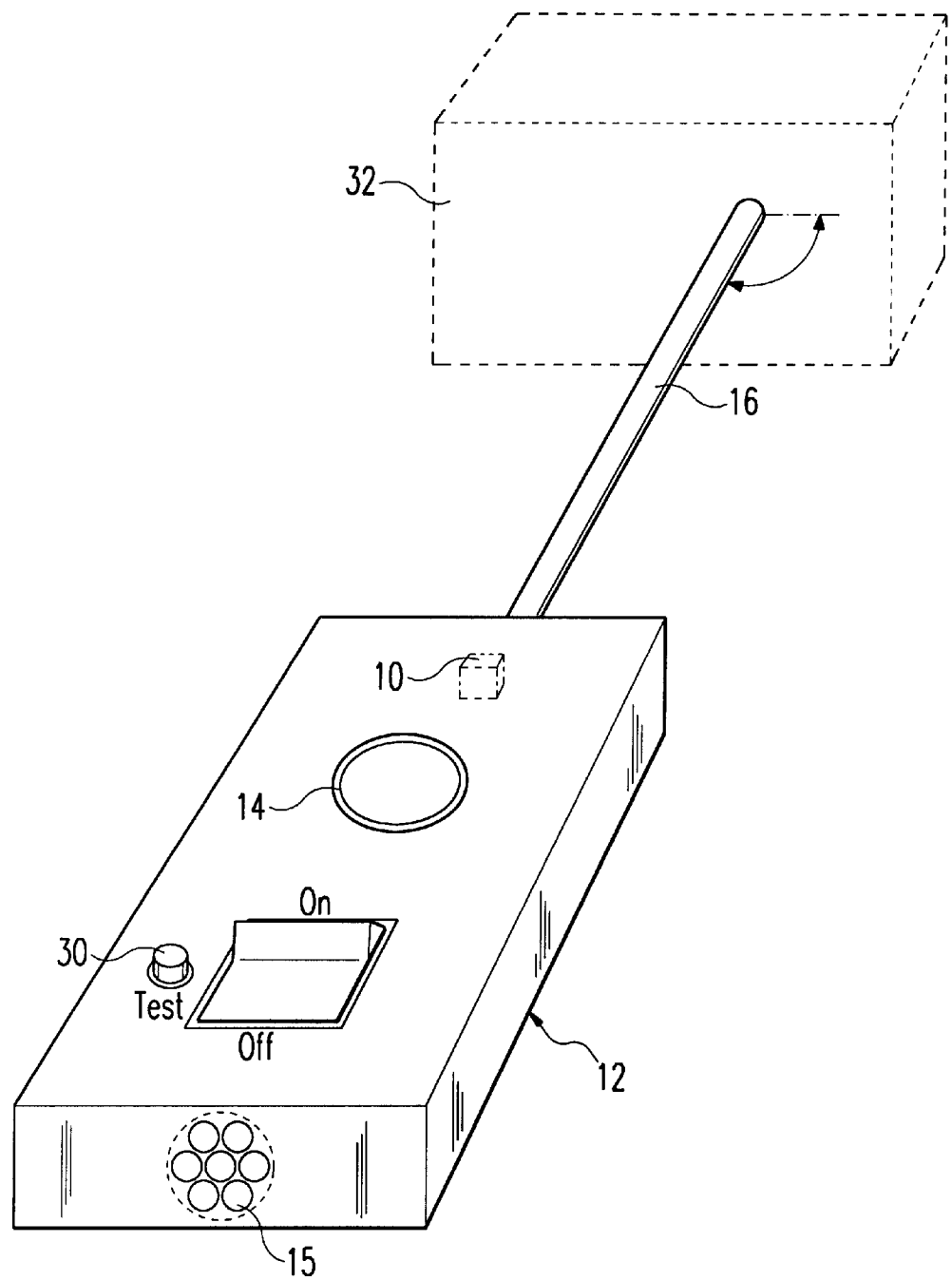
FIG. 1 is a view onto the face side of an apparatus according to the invention.
Figure 2:
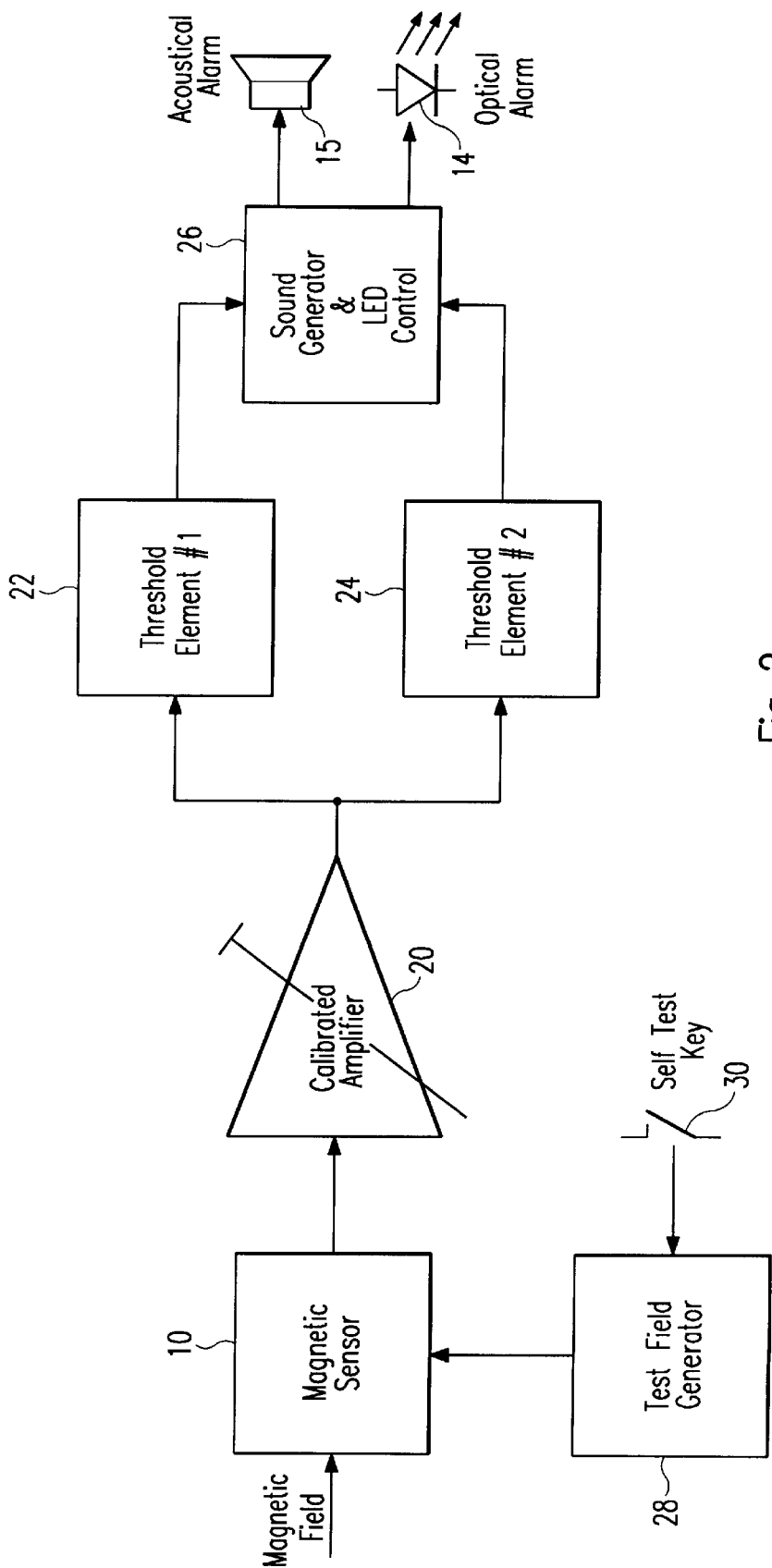
FIG. 2 is a circuit diagram in block form of a preferred electronic circuit for the apparatus according to FIG. 1.

Referring now to the accompanying drawing FIG. 1 shows a magnetic stray field threshold value testing apparatus in front view, and FIG. 2 a preferred circuitry for the apparatus. The apparatus shown in FIG. 1 comprises as magnetic field sensor a Hall probe 10 mounted within an elongated housing 12 at the small front side 12a thereof. The field sensor is coupled to an electronic circuit, to be described in detail with reference to FIG. 2. The electronic circuit is coupled to a power source (not shown) such as a battery or a mains supply, and to an optical and/or acoustical warning device, as an indicator light source as an LED 14 and a buzzer 15 respectively. The circuit activates the warning device(s) when magnitude of the output signal (Hall voltage) of the sensor exceeds half of the permitted maximum field strength value (threshold value) to produce a pre-warning signal. It activates the warning device(s) to produce a main warning signal when the predetermined threshold value is exeeded. Means are provided to adjust the threshold value.

A rod 16 of non-magnetic material and serving as distance determining means protrudes from the front side 12a of the housing 12, The rod 16 is preferably made of flexible material such as rubber or plastic. Alternatively, the rod may be an elongated helical wire coil made from nonmagnetic metal.

The electronic circuit shown in FIG. 2 comprises calibrated amplifier means 20 including means for adjusting the gain and delivering an output signal independent of the polarity of the input signal. The amplifier may be a commercially available device or a unit integrated into the Hall sensor and coupled to a potentiometer for gain adjustment. Each of first and second threshold elements 22, 24 have their input coupled to the output of the amplifier 20 and their output coupled to respective inputs of a sound signal generator and LED control circuit 26. The control circuit 26 has a first output coupled to an acoustical alarm device, as a buzzer 15, and a second output coupled to an optical alarm device, as LED 14.

The first threshold element 22 is adjusted so it delivers an output to the corresponding input of the control circuit 26 if and when the field strength sensed exceeds half of the predetermined threshold value. The control circuit 26 responds by producing a preliminary warning signal, such as an intermittent sound and/or a flashing optical signal. The second threshold element 24 is adjusted so that it applies an output signal to the control circuit if and when the maximum allowable magnetic field strength (threshold value) is exceeded. The control circuit 26 then responds by producing persistent main alarm signals.

The circuit of FIG. 2 further includes a test field generator 28 for self testing the apparatus by producing a test magnetic field at the location of the sensor 10. In a preferred embodiment the test field generator 28 includes (not shown here) a wire coil having, say 1 to 5 windings around or very close to the magnetic field sensor. The coil connected in series with a currrent source providing a few milliamps for creating the test field. In series to the coil is also an adjustable current limiting resistor and a push-button switch 30. The current limiting resistor is adjusted in combination with the dimensions of the coil and the output voltage of the current source so that when switch 30 is actuated, the test field produced at the sensor is between 50 and 100% of the maximum allowed field. Thus, when only the main switch 30 is actuated and the alarm devices respond, it is sure that the apparatus functions properly and the power supply is in order.

In practical use of the apparatus the end of rod 16 must touch the surface of the package 32 to be investigated. Hereby the length of rod 16 being normal to said surface. This way the field sensor 10 comes in a predetermined distance to any side of the package under investigation. When now with activated main switch 31 the alarm sounds or flashes intermittendly a still permisseable stray field exists. Constant sound and/or constant warning light indicates that permisseable stray fields have been exceeded.

Common Hall probes or Hall probes with an integrated amplifier as well as magnetic field-sensitive resistors may be used as sensors. So called "fluxgates" i.e. second harmonic probes, or flux coils would also be choices for sensors in this invention.

What is claimed is:

1. An apparatus for testing whether the strength of a stray magnetic field emanating from a package to be investigated exceeds a predetermined value (threshold value) at a given distance from a surface of said package, said apparatus comprising:

a magnetic field sensor producing an electric output signal that is a function of the magnetic field sensed;

indicating means producing a signal indicating that the threshold value is exceeded;

circuit means having an input coupled to said sensor and an output coupled to said indicating means to actuate said indicating means when said threshold value is exceeded;

nonmagnetic distance defining means which when contacting selected point on a surface of said package establishes a predetermined distance between said point and said sensor.

2. The apparatus as claimed in claim 1, wherein said distance defining means comprises a rod.

3. The apparatus as claimed in claim 1, wherein said distance defining means is flexible.

4. The apparatus as claimed in claim 1, further comprising a housing, said distance defining means being a rod protruding from a face of said housing.

5. The apparatus as claimed in claim 1 wherein said circuit means comprises amplifier means adjustable for setting the value of the sensor output signal at which said indicating means is actuated.

6. The apparatus as claimed in claim 1 further comprising means for testing the function of the apparatus.

7. The apparatus as claimed in claim 6, wherein said testing means comprises means for subjecting said sensor to a magnetic test field.

8. The apparatus as claimed in claim 6, wherein said testing means comprises means for applying to said sensor a magnetic test field having a strength which is a fraction of said threshold field value.

9. The apparatus as claimed in claim 6 wherein said testing means comprises means for applying to said sensor a magnetic test field having a strength between 50 and 100 percent of said threshold value.

10. The apparatus as claimed in claim 1 further comprising means for generating a pre-warning signal when the field sensed exceeds half the threshold field value.

11. The apparatus as claimed in claim 1, wherein said threshold value is between about 8 to 12 A/cm (about 10 to 15 Oersted) at a distance of about 20 cm.

* * * * *